United States Patent
Sako (10) Patent No.: US 10,048,310 B2
(45) Date of Patent: Aug. 14, 2018

(54) PARTIAL DISCHARGE SIGNAL PROCESSING DEVICE

(71) Applicant: Mitsubishi Electric Corporation, Chiyoda-ku, Tokyo (JP)

(72) Inventor: Hiroshi Sako, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/313,437

(22) PCT Filed: Sep. 17, 2014

(86) PCT No.: PCT/JP2014/074519
§ 371 (c)(1),
(2) Date: Nov. 22, 2016

(87) PCT Pub. No.: WO2016/042614
PCT Pub. Date: Mar. 24, 2016

(65) Prior Publication Data
US 2017/0192048 A1    Jul. 6, 2017

(51) Int. Cl.
*G01R 31/12* (2006.01)
*G01R 31/14* (2006.01)

(52) U.S. Cl.
CPC ......... *G01R 31/1272* (2013.01); *G01R 31/14* (2013.01)

(58) Field of Classification Search
None
See application file for complete search history.

(56) References Cited

U.S. PATENT DOCUMENTS 5,859,590 A * 1/1999 Otani ............... H02H 1/0015
                                                        324/520
6,452,416 B1    9/2002 Kaneda et al.
(Continued)

FOREIGN PATENT DOCUMENTS

CN    103487728 A    1/2014
JP    4-084778 A     3/1992
(Continued)

OTHER PUBLICATIONS

International Search Report (PCT/ISA/210) dated Jan. 6, 2015, by the Japanese Patent Office as the International Searching Authority for International Application No. PCT/JP2014/074519.
(Continued)

*Primary Examiner* — Jermele M Hollington
*Assistant Examiner* — Suresh K Rajaputra
(74) *Attorney, Agent, or Firm* — Buchanan Ingersoll & Rooney PC (57) ABSTRACT

A partial discharge signal processing device of the present invention is provided with: a partial discharge signal receiving unit disposed inside a high voltage electric machine device; a partial discharge signal processing unit; and a coaxial cable connecting the partial discharge signal receiving unit and the partial discharge signal processing unit. In addition, the partial discharge signal receiving unit comprises an electromagnetic wave receiving unit that receives electromagnetic waves generated by partial discharge. Further, the partial discharge signal processing unit comprises: a detection unit that detects a partial discharge signal transmitted through the coaxial cable; a band limiting unit that limits the frequency bandwidth of the partial discharge signal; an attenuation amount correction unit that corrects an attenuated partial discharge signal; and a signal output unit
(Continued)

that outputs, to an external device, the corrected partial discharge signal.

4 Claims, 10 Drawing Sheets

(56) References Cited

U.S. PATENT DOCUMENTS

| | | |
|---|---|---|
| 2006/0132144 A1 | 6/2006 | Kato et al. |
| 2009/0027062 A1* | 1/2009 | Maruyama ......... G01R 31/1254 324/544 |
| 2013/0006560 A1* | 1/2013 | Cern .................. G01R 31/1272 702/66 |

FOREIGN PATENT DOCUMENTS

| | | |
|---|---|---|
| JP | 11-231015 A | 8/1999 |
| JP | 2002-071742 A | 3/2002 |
| JP | 2006-250772 A | 9/2006 |
| JP | 2008-139207 A | 6/2008 |
| JP | 2011-095036 A | 5/2011 |
| JP | 2012-145368 A | 8/2012 |

OTHER PUBLICATIONS

Written Opinion (PCT/ISA/237) dated Jan. 6, 2015, by the Japanese Patent Office as the International Searching Authority for International Application No. PCT/JP2014/074519.

Extended European Search Report dated May 18, 2018, by the European Patent Office in corresponding European Patent Application No. 14 901 997.8 (7 pages).

\* cited by examiner

PARTIAL DISCHARGE SIGNAL PROCESSING DEVICE

TECHNICAL FIELD

The present invention relates to a partial discharge signal processing device that performs signal processing of a partial discharge signal in the inside of an electric machine.

BACKGROUND ART

Generally, if deterioration of an insulation material that insulates a conductor portion proceeds in the inside of an electric machine, more particularly, a high voltage electric machine, partial discharge generated from the deteriorated portion tends to be increased.

If the partial discharge in the inside of the high voltage electric machine is neglected, dielectric breakdown is likely to occur and it brings about the possibility of a serious accident. Consequently, the partial discharge is detected and the degree of the deterioration of the insulation material needs to be grasped so as not to develop to the serious accident. Therefore, it is effective to place a partial discharge measurement device that measures the partial discharge in the inside of the high voltage electric machine.

When a turbine generator is taken as an example, partial discharge measurement that is performed to grasp the degree of the deterioration of the insulation of the high voltage electric machine is generally classified into offline measurement that is performed during a stop of operation and online measurement that is performed during operation. In the offline measurement, a voltage around the rated voltage is applied to each phase of an armature during the stop of the operation of the turbine generator by using a high voltage power supply and partial discharge generated at that time is measured. Furthermore, in the online measurement, since the rated voltage is generated in the armature during the operation of the turbine generator, the partial discharge generated at that time is continuously measured for a long period.

If the partial discharge is generated, a partial discharge signal having wide frequency components ranging from several kHz to several GHz is generated as a pulse-like signal that propagates in a winding conductor or as an electromagnetic wave that propagates in space; and therefore, a certain frequency band is selected from the partial discharge signal and measurement is performed by using an appropriate sensor.

As for a method of measuring the partial discharge in the inside of the high voltage electric machine, the method can be performed by detecting, for example, current, electromagnetic wave, sound, vibration, and the like by means of a sensor. A method of measuring the electromagnetic wave generated accompanying the partial discharge is expected from detection sensitivity, the goodness of S/N ratio, the width of detection range, and the like. More particularly, a signal ranging from several kHz to several GHz is included in the electromagnetic wave generated accompanying the partial discharge and there has been investigated a method that measures an electromagnetic wave of an ultra high frequency (UHF) band from 300 MHz to 3 GHz.

Here, it is characterized in that, in propagation, a low frequency side signal (from several kHz to several tens MHz) is relatively low in signal attenuation, but is susceptible to noise; and a high frequency side signal (from several hundreds MHz to several GHz) is relatively high in signal attenuation, but is insusceptible to noise. Thus, in the offline measurement which is relatively low in noise level, the low frequency side signal is detected so as to be able to detect even a partial discharge generated in the distance. Furthermore, in the online measurement which is relatively high in noise level, the high frequency side signal insusceptible to noise is detected; and as for large signal attenuation, it is general to place a sensor at a position near a partial discharge source and to manage by applying a sensor with high receiving sensitivity.

Consequently, as a device that detects the partial discharge by using the electromagnetic wave generated accompanying the partial discharge such as this, for example, a partial discharge detection device shown in Patent Document 1 discloses that a waveguide antenna that receives an electromagnetic wave leaked from an insulating spacer is attached to the outer peripheral surface of the insulating spacer, and the waveguide antenna is composed of a waveguide portion and a coaxial cable connector placed on the waveguide portion; the waveguide portion is provided with a metallic short-circuit plate at one end and is formed with an opening portion that covers a part of the outer peripheral surface of the insulating spacer at the other end; and thus, even when a detector of the partial discharge is not preliminarily attached to the inside of a gas-insulated device, the partial discharge can be detected by detecting the electromagnetic wave leaked from the gas-insulated device.

PRIOR ART DOCUMENT

Patent Document

Patent Document 1: JP2008-139207A

SUMMARY OF INVENTION

Problems to be Solved by the Invention

In the conventional partial discharge detection device, the certain frequency bandwidth in the partial discharge signal from several kHz to several GHz needs to be selected and transmitted from a receiving unit to a signal processing unit; and therefore, it is general to use a coaxial cable capable of transmitting a high frequency signal as a transmission line. However, as for the coaxial cable, the higher the frequency of the signal to be transmitted, the larger the attenuation amount of the signal. Then, in order to enhance accuracy of the partial discharge measurement, the signal attenuation amount needs to be decreased by using a coaxial cable which is small in signal attenuation amount per unit length and/or a coaxial cable which is short in length. However, generally, since the high voltage electric machine is large-sized, the distance between the receiving unit and the signal processing unit tends to become longer; and accordingly, a problem exists in that the long coaxial cable needs to be used and the partial discharge signal that reaches the signal processing unit extremely becomes small.

Furthermore, an amplifier that corrects the signal attenuation amount can also be placed between the receiving unit and the signal processing unit. However, the frequency of the signal generated by the partial discharge has the certain bandwidth and accordingly, in the case of being transmitted by the coaxial cable, there arises a problem in that if the bandwidth is wide, signal attenuation of an upper limit frequency of the bandwidth becomes larger than that of a lower limit frequency of the bandwidth. Then, a problem exists in that it is difficult to make frequency dependent properties of signal attenuation characteristics due to the coaxial cable the same as frequency dependent properties of signal amplification characteristics due to the amplifier and it is difficult to reproduce the strength of the signal at the receiving unit in the signal processing unit.

The present invention has been made to solve the above described problem, and an object of the present invention is to provide a partial discharge signal processing device capable of accurately reproducing the strength of a signal even when a transmission line is used between a partial discharge signal receiver and a partial discharge signal processor.

Means for Solving the Problems

In order to solve the above problem, according to the present invention, there is provided a partial discharge signal processing device including: a partial discharge signal receiver that receives an electromagnetic wave as a partial discharge signal, which is generated by partial discharge in an electric machine; a partial discharge signal processor which detects the partial discharge signal, and performs signal processing; and a coaxial cable through which the partial discharge signal receiver is connected to the partial discharge signal processor to transmit the partial discharge signal. The partial discharge signal processor includes: a frequency limiting circuitry which sets a reference frequency to equal to or higher than 1 GHz, and limits a frequency of the partial discharge signal by a frequency bandwidth at which fluctuations in attenuation amount are within 0.1 dB centering on the reference frequency; an attenuation amount correcting circuitry that corrects a value of the partial discharge signal at the bandwidth on the basis of the signal attenuation amount of signal attenuation characteristics at the bandwidth of said coaxial cable; and a signal outputting circuitry that outputs the corrected partial discharge signal.

Advantageous Effect of the Invention

According to the partial discharge signal processing device of the present invention, the electromagnetic wave generated by the partial discharge is received and the partial discharge signal transmitted by the transmission line is limited to the preliminarily frequency and bandwidth, whereby signal processing of the partial discharge signal can be accurately performed without being influenced by the frequency characteristics of the transmission line.

MODE FOR CARRYING OUT THE INVENTION

Embodiment 1

Figure 1:
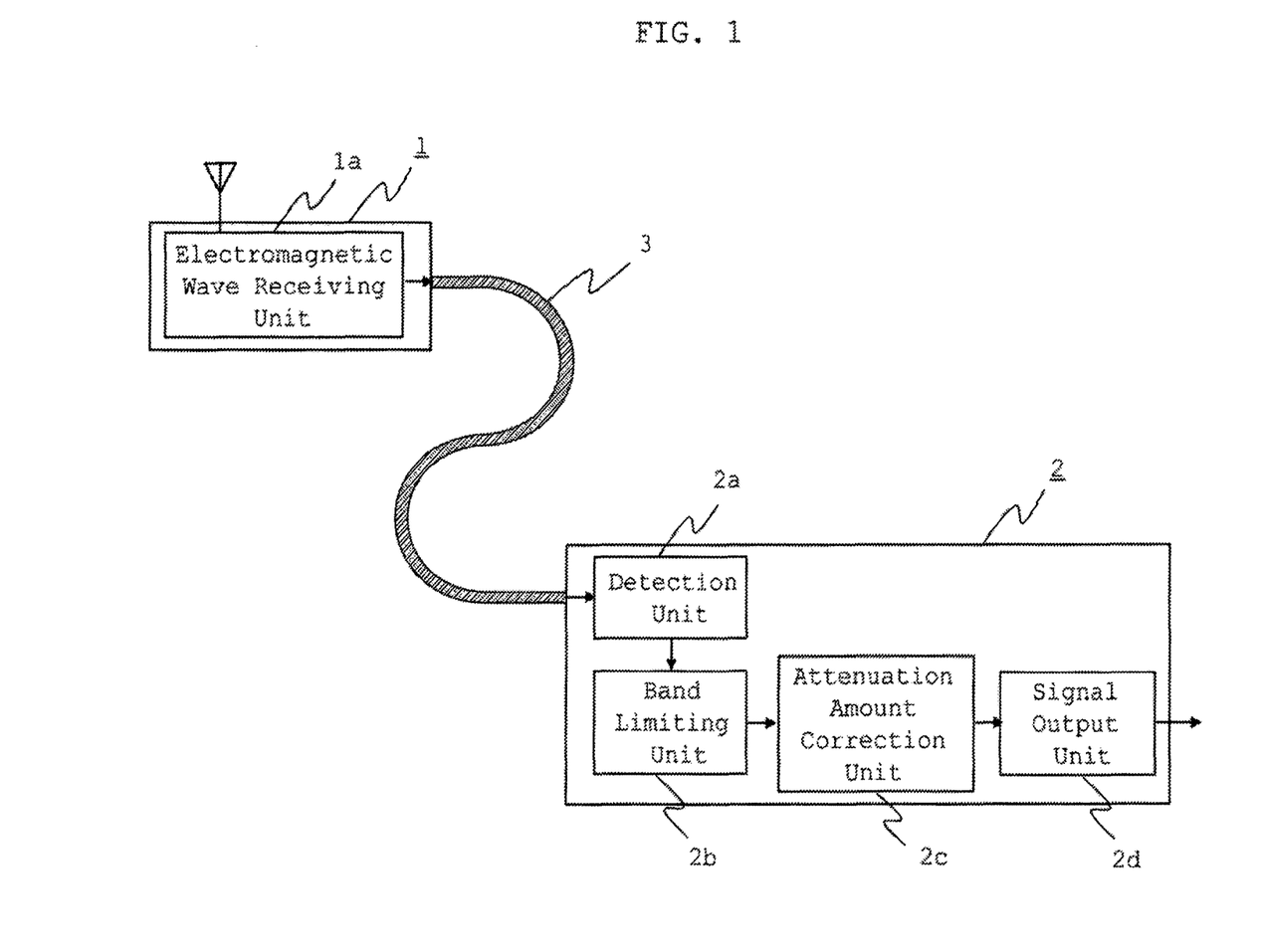
FIG. 1 is a view showing the schematic configuration of a partial discharge signal processing device according to Embodiment 1.
Figure 2:
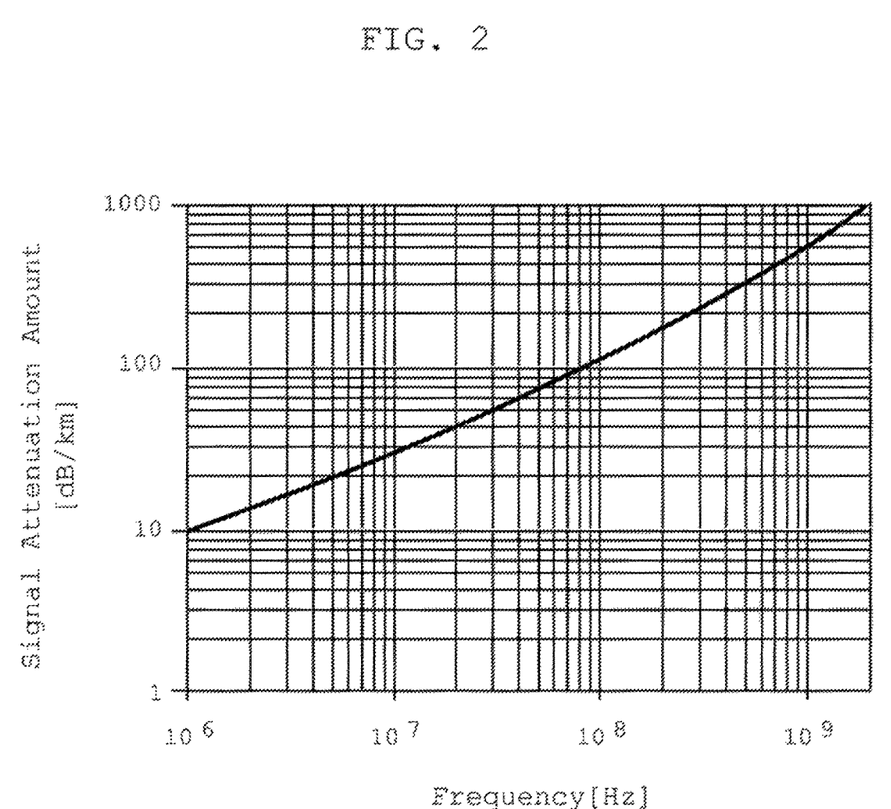
FIG. 2 is a view showing an example of the signal attenuation characteristics of a coaxial cable.
Figure 3:
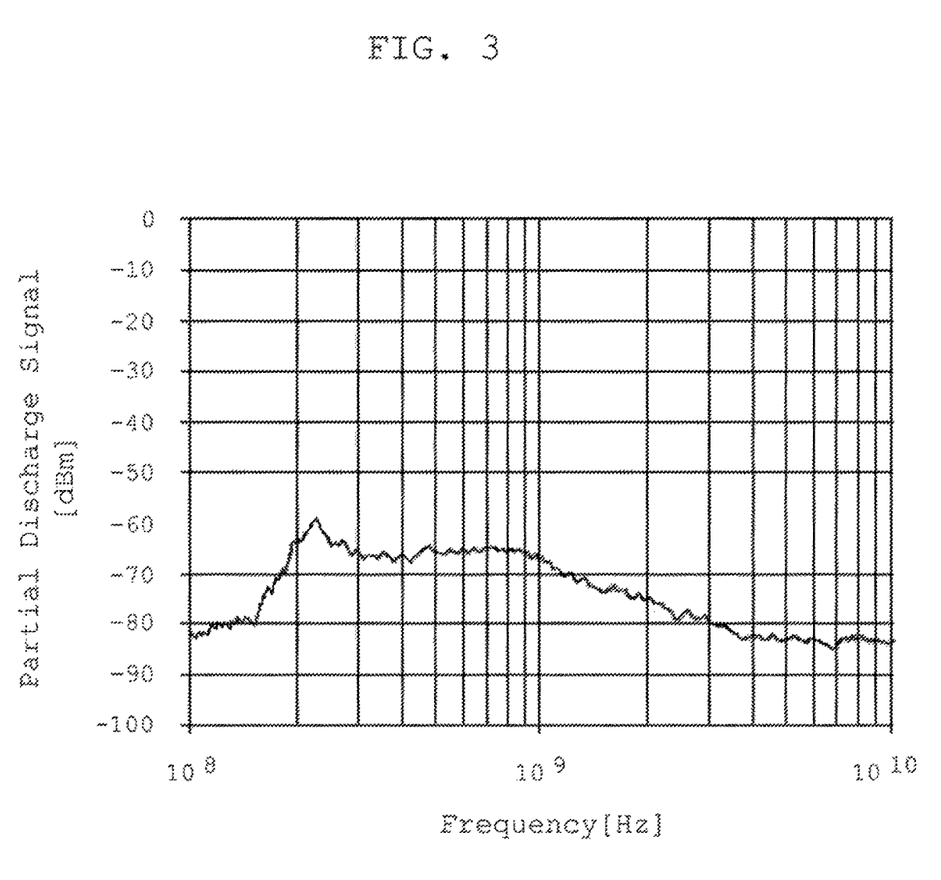
FIG. 3 is a view showing an example of the frequency characteristics of an electromagnetic wave by partial discharge.
Figure 4:
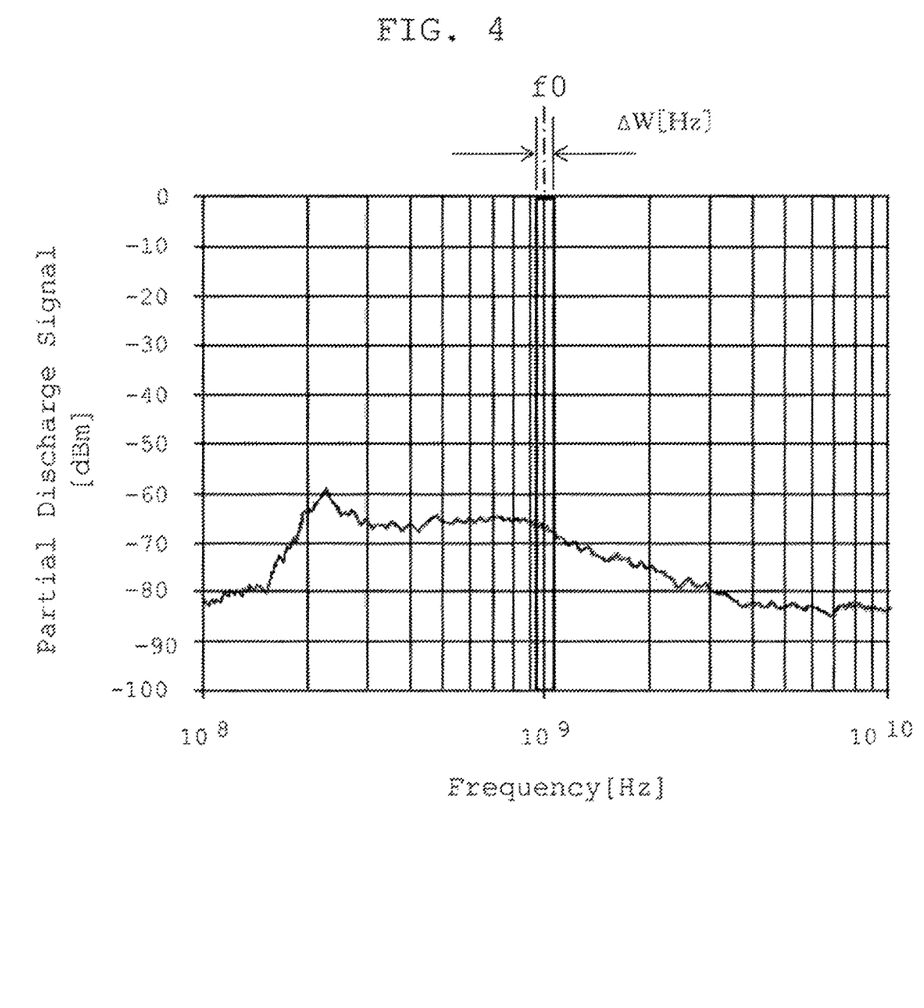
FIG. 4 is a view showing a reference frequency and a bandwidth which are for use in partial discharge signal processing of the partial discharge signal processing device according to Embodiment 1.

FIG. 1 is a view showing the schematic configuration of a partial discharge signal processing device according to Embodiment 1; FIG. 2 is a view showing an example of the signal attenuation characteristics of a coaxial cable; FIG. 3 is a view showing an example of the frequency characteristics of an electromagnetic wave caused by partial discharge; and FIG. 4 is a view showing a reference frequency and a bandwidth which are used for partial discharge signal processing.

First, the configuration of the partial discharge signal processing device according to Embodiment 1 will be described by using FIG. 1. In FIG. 1, the partial discharge signal processing device is composed of three segments: a partial discharge signal receiving unit 1 that is placed inside or outside a high voltage electric machine; a partial discharge signal processing unit 2 that is provided outside the high voltage electric machine; and a coaxial cable 3 serving as a transmission line through which the partial discharge signal receiving unit 1 is connected to the partial discharge signal processing unit 2. Furthermore, the partial discharge signal receiving unit 1 is constituted by an electromagnetic wave receiving unit 1a that detects the electromagnetic wave generated by partial discharge. Furthermore, the partial discharge signal processing unit 2 includes: a detection unit 2a that detects a partial discharge signal transmitted through the coaxial cable 3; a band limiting unit 2b in which the partial discharge signal detected by the detection unit 2a is limited by a frequency band centering on a reference frequency; an attenuation amount correction unit 2c that corrects the partial discharge signal attenuated by the coaxial cable 3 in the limited frequency band; and a signal output unit 2d that outputs the corrected partial discharge signal to an external device.

Next, the operation of the partial discharge signal processing device according to Embodiment 1 will be described with reference to FIG. 1 to FIG. 4.

Generally, the partial discharge receiving unit is placed inside or outside the high voltage electric machine. However, for example, as shown in FIG. 1, in this embodiment, a description will be made on a case where reception of the partial discharge is performed such that the electromagnetic wave generated accompanying the partial discharge is received and the partial discharge signal receiving unit 1 is placed inside the high voltage electric machine. Furthermore, the partial discharge signal processing unit 2 is placed outside the high voltage electric machine and is connected to the partial discharge signal receiving unit 1 via the coaxial cable 3 of the transmission line.

The partial discharge signal processing unit 2 performs signal processing and the like of a high frequency partial discharge signal transmitted via the coaxial cable 3; however, when the partial discharge signal passes through the coaxial cable 3, attenuation of the signal is produced. The longer the length of the coaxial cable 3, the larger the attenuation amount of the signal; and the higher the frequency, the larger the signal attenuation amount as shown by the signal attenuation characteristics of the coaxial cable of FIG. 2.

On the other hand, the frequency characteristics of the electromagnetic wave caused by the partial discharge includes wide frequency components, for example, as shown in FIG. 3; and accordingly, if the detected electromagnetic wave is transmitted as the partial discharge signal through the coaxial cable, the attenuation amount is small in a low frequency area and the attenuation amount becomes large in a high frequency area. Furthermore, since the length of the coaxial cable 3 becomes long in a large-sized high voltage electric machine, the attenuation amount becomes larger. By these reasons, the partial discharge signal received by the partial discharge signal processing unit 2 has strength and frequency characteristics which are different from those of a signal received by the partial discharge signal receiving unit 1.

Next, a description will be made on a case where a turbine generator serving as the high voltage electric machine is taken as an example. When a partial discharge signal is received as an electromagnetic wave by online measurement of partial discharge of the turbine generator, an electromagnetic wave from several hundreds MHz to several GHz, which is relatively insusceptible to noise, is received; and accordingly, attenuation until the electromagnetic wave reaches the electromagnetic wave receiving unit 1a is large because of its characteristics. Furthermore, the electromagnetic wave received by the electromagnetic wave receiving unit 1a is transmitted as a high frequency partial discharge signal to the partial discharge signal processing unit 2 placed outside the turbine generator via the coaxial cable 3. Attenuation of the signal is generated when the partial discharge signal passes through the coaxial cable 3; and the longer the length of the coaxial cable 3, the larger the signal attenuation amount; and the higher the frequency of the signal, the larger the signal attenuation amount as shown by the signal attenuation characteristics of the coaxial cable of FIG. 2. More specifically, if the partial discharge measurement by online is performed in a large-sized turbine generator, the signal attenuation amount is inevitably increased extremely (the partial discharge signal in the partial discharge signal processing unit 2 becomes extremely small); and accordingly, accurate partial discharge measurement cannot be achieved if signal attenuation in the coaxial cable 3 is not grasped.

Consequently, in the present invention, the partial discharge signal processing unit 2 sets a reference frequency f0, at which signal processing of the partial discharge signal is performed, to equal to or higher than 1 GHz which is insusceptible to noise and sets to a bandwidth ΔW which, for example, fluctuations in attenuation amount is within 0.1 dB so that the signal attenuation amount of the coaxial cable 3 can be regarded to be uniform centering on the reference frequency f0. As shown in FIG. 4, if the reference frequency f0 is set to 1.00 GHz and the bandwidth ΔW is set to ±1% of 1.00 GHz, the signal attenuation amount due to the coaxial cable 3 in the case of a lower limit bandwidth of 0.99 GHz is 565 dB/km and the signal attenuation amount in the case of an upper limit bandwidth of 1.01 GHz is 575 dB/km; and the difference therebetween is 10 dB/km. Therefore, when the coaxial cable 3 of 10 m is used, the signal attenuation amount in the case of the lower limit bandwidth of 0.99 GHz is 5.65 dB and the signal attenuation amount in the case of the upper limit bandwidth of 1.01 GHz is 5.75 dB; and the difference therebetween is 0.1 dB and the signal attenuation amount can be regarded to be uniform. More specifically, the bandwidth ΔW is set to ±0.01 GHz (±1% of the reference frequency f0) with respect to 1.00 GHz of the reference frequency f0; and thus, the difference between the attenuation amounts is 0.1 dB and correction of the partial discharge signal can be easily performed.

On the other hand, if the reference frequency f0 is set to 1.00 GHz and the bandwidth ΔW is set to ±50% of 1.00 GHz, in the example of the signal attenuation characteristics of the coaxial cable 3 of FIG. 2, the signal attenuation amount in the case of a lower limit bandwidth of 0.50 GHz is 340 dB/km and the signal, attenuation amount in the case of an upper limit bandwidth of 1.50 GHz is 780 dB/km; and the difference therebetween is 400 dB/km. When a coaxial cable of 10 m is used, the signal attenuation amount in the case of the lower limit bandwidth of 0.50 GHz is 3.40 dB and the signal attenuation amount in the case of the upper bandwidth of 1.50 GHz is 7.80 dB; and the difference therebetween is 4.40 dB. In this case, the signal attenuation amount cannot be regarded to be constant any more. If the length of the cable becomes longer, the difference between the attenuation amounts of the lower and the upper bandwidths becomes larger; and accordingly, it becomes difficult to correct the partial discharge signal by the partial discharge signal processing unit 2 according to the length of the cable.

When the bandwidth of the partial discharge signal in the partial discharge signal processing is narrowed, the signal treated in the partial discharge measurement is limited to the set frequency band. However, if the electromagnetic wave caused by the partial discharge exists in the frequency band, the partial discharge measurement is made possible. As is apparent from the difference between the online measurement and the offline measurement, to select the frequency band to be detected according to a purpose is a peculiar technique of the partial discharge measurement; and therefore, essential qualities of the partial discharge measurement are not impaired even when the frequency band at which signal processing is performed is narrow-banded as shown in the present invention.

Incidentally, here, the attenuation amount is preliminarily grasped according to the length of the coaxial cable 3 for use in the transmission of partial discharge, the bandwidth is set so that the signal attenuation amount can be regarded to be uniform, and a correction coefficient that corrects the attenuation amount of the partial discharge signal in the an attenuation amount correction unit 2c is determined.

Furthermore, the attenuation amount at the reference frequency f0 may be used for the attenuation amount for use in the correction of the partial discharge signal and an average value of the attenuation amount at the frequency within the bandwidth ΔW may be used.

As described above, any frequency area for use in the partial discharge measurement can be selected if the frequency area is an area in which the frequency of the electromagnetic wave caused by the partial discharge is included; however, in the coaxial cable 3, it is necessary to set to such an extent of a bandwidth ΔW that the signal attenuation amount of the partial discharge signal can be regarded to be uniform. The signal attenuation amount due to the coaxial cable 3 is regarded as a constant value and the correction is performed by determining the frequency band of the partial discharge signal at which the signal processing is performed; and thus, it becomes possible that the signal strength of the partial discharge signal in the partial discharge signal processing unit 2 can foe corrected to the signal strength in the partial discharge signal receiving unit 1 and accuracy of the partial discharge measurement can be improved by outputting to an external measurement device.

Furthermore, if the signal attenuation amount of the coaxial cable 3 is decreased by a change in section size and/or a change in material of the coaxial cable and the attenuation amount of the partial discharge signal is decreased by minimizing a connection route of the coaxial cable 3, partial discharge signal measurement with higher accuracy can be achieved. This effect becomes more remarkable when a high frequency partial discharge signal that is large in signal attenuation amount is treated.

As described above, according to the partial discharge signal processing device according to Embodiment 1, when the electromagnetic wave generated by the partial discharge in the inside of the high voltage electric machine is received and the received electromagnetic wave is transmitted as the high frequency partial discharge signal by the transmission line, signal processing of the partial discharge signal is performed by the preliminarily defined reference frequency and the bandwidth. Therefore, an effect exists in that the partial discharge signal is not influenced by the frequency characteristics of the transmission line and the partial discharge signal is accurately corrected and is outputted to the external measurement device; and thus, the partial discharge signal can be accurately measured.

Embodiment 2

Figure 5:
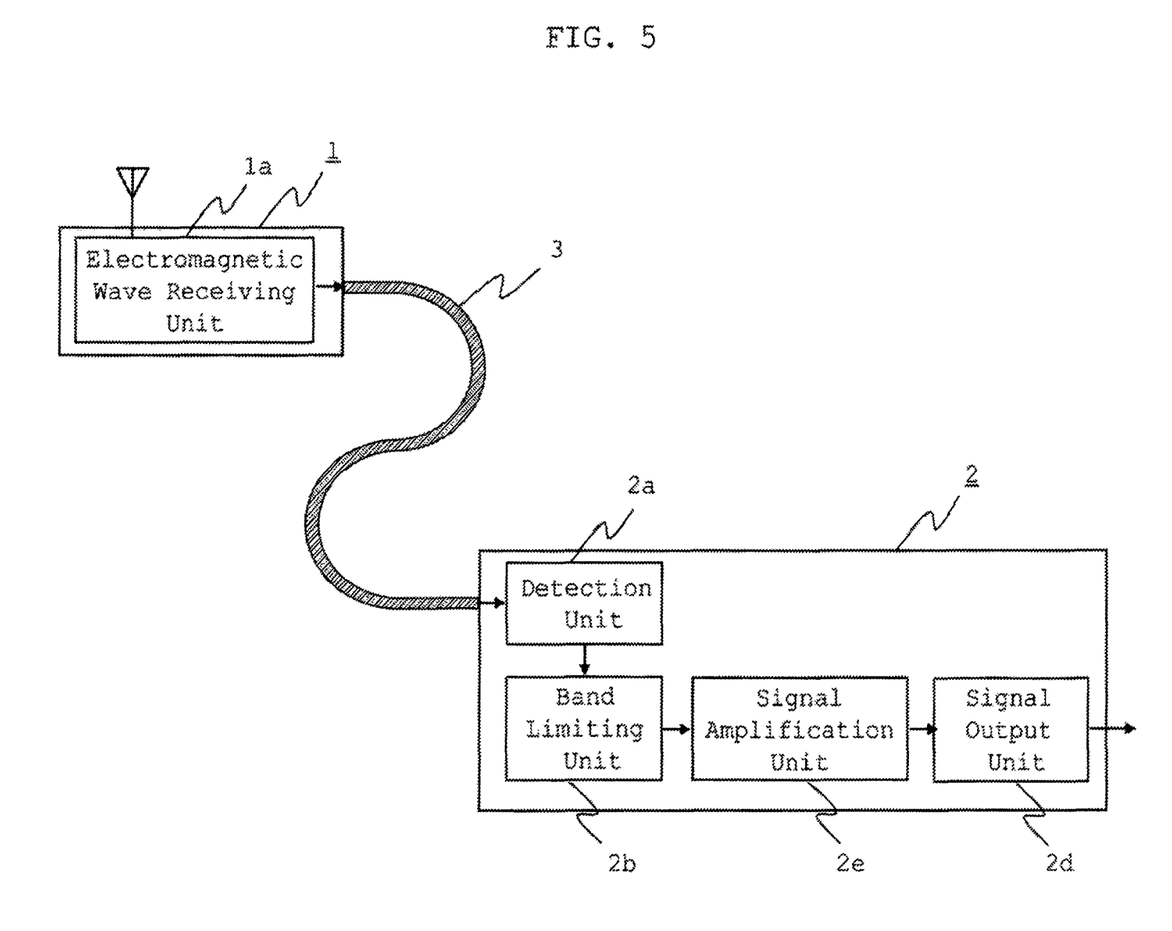
FIG. 5 is a view showing the schematic configuration of a partial discharge signal processing device according to Embodiment 2.
Figure 6:
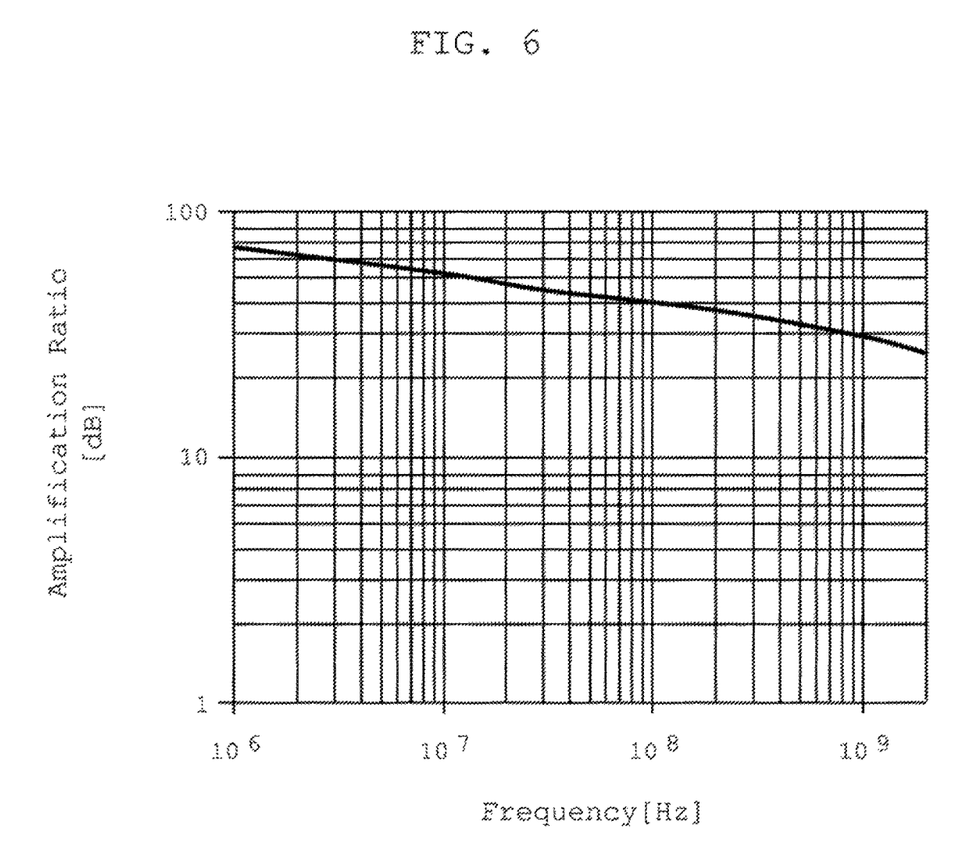
FIG. 6 is a view showing an example of the frequency characteristics of a signal amplifier in the partial discharge signal processing device according to Embodiment 2.

FIG. 5 is a view showing the schematic configuration of a partial discharge signal processing device according to Embodiment 2; and FIG. 6 is a view showing an example of the frequency characteristics of a signal amplifier. A difference from the partial discharge signal processing device according to Embodiment 1 shown in FIG. 1 is that, in a partial discharge signal processing device according to Embodiment 2, a signal amplification unit that amplifies the partial discharge signal by the amplification ratio corresponding to the attenuation amount in a coaxial cable is served as the attenuation amount correction unit. Other constitutional elements are the same as that of Embodiment 1 and therefore their description will be omitted.

Next, the operation of the partial discharge signal processing device according to Embodiment 2 will be described with reference to FIG. 5 and FIG. 6.

In Embodiment 2, in order to correct the attenuation amount of a coaxial cable 3, as the function of the attenuation amount correction unit, a signal amplification unit 2e amplifies a partial discharge signal by an amplification ratio corresponding to the attenuation amount in the coaxial cable 3. Then, in order to correct the strength of the partial discharge signal which is attenuated between a partial discharge signal receiving unit 1 and a partial discharge signal processing unit 2 in a bandwidth ΔW centering on a reference frequency f0, the signal amplification unit 2e amplifies the partial discharge signal corresponding to the attenuation amount. Here, the amplification ratio of the signal amplification unit 2e is determined in consideration of the length of the coaxial cable 3 and attenuation characteristics in the set bandwidth ΔW.

When signal processing is performed in a wide band of an electromagnetic wave caused by partial discharge, it is ideal to define a signal amplification ratio of the signal amplifier so that signal attenuation due to the coaxial cable is corrected for each frequency. However, a general signal amplifier has the frequency characteristics as shown in FIG. 6; and accordingly, the signal amplifier becomes complicated and expensive in order to correct the attenuation amount for each frequency. Furthermore, correction taking info account of the length of the coaxial cable becomes more complicated. In Embodiment 2, the frequency at which the signal processing is performed is set to such an extent of a bandwidth that the signal attenuation amount of the coaxial cable can be regarded to be uniform. Therefore, the amplification ratio does not need to be adjusted for each frequency and the signal amplifier can be manufactured in a simple structure at a low cost.

As described above, according to the partial discharge signal processing device according to Embodiment 2, the partial discharge signal attenuated in the transmission line is amplified at only the set bandwidth by the signal amplifier; and thus, there exists an effect similar to that of Embodiment 1 and an effect in that there can be used the signal amplifier in which a setting of the amplitude amount is easy and simple.

Embodiment 3

Figure 7:
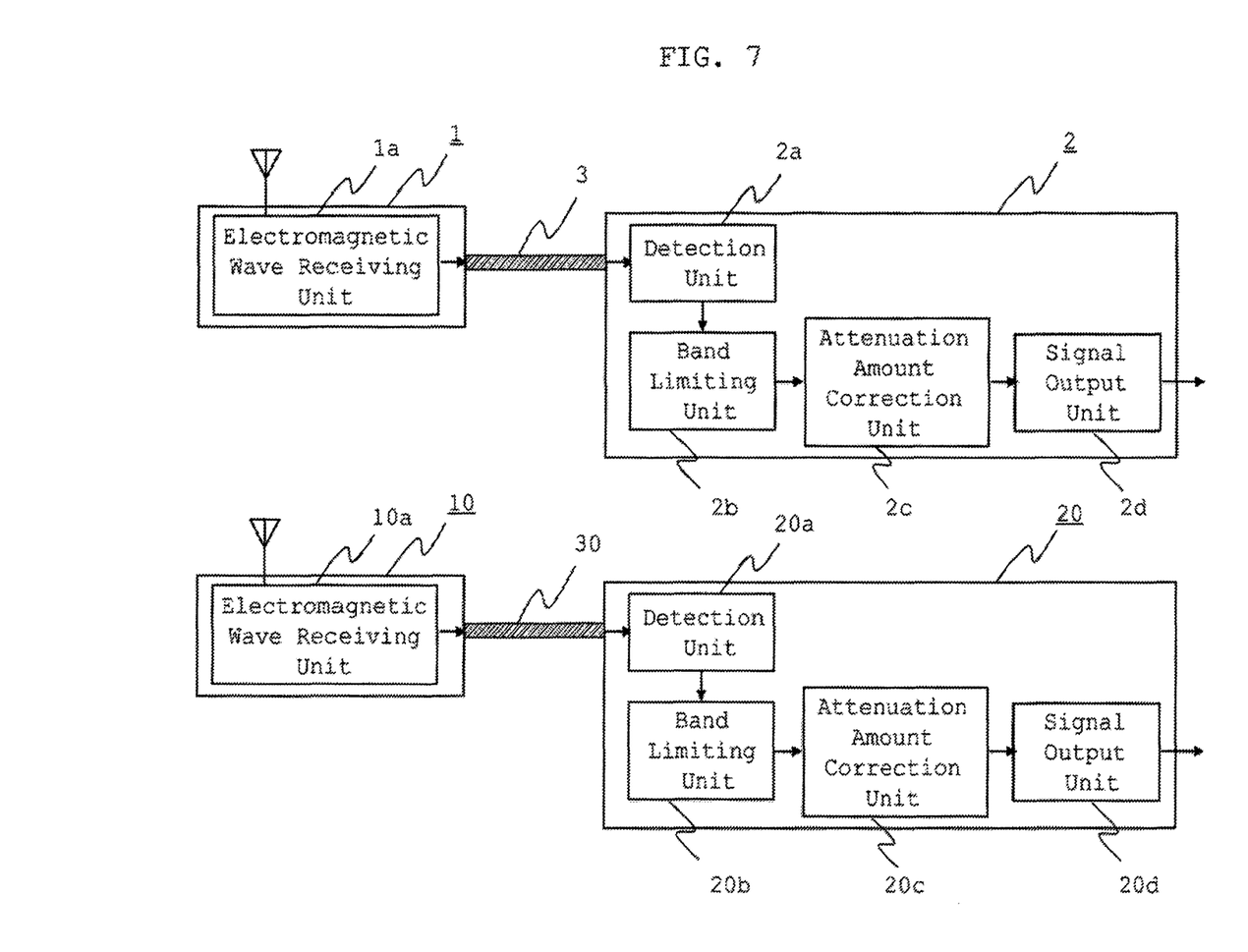
FIG. 7 is a view showing the schematic configuration of a partial discharge signal processing device according to Embodiment 3.

FIG. 7 is a view showing the schematic configuration of a partial discharge signal processing device according to Embodiment 3. In the partial discharge signal processing device according to Embodiment 3, a plurality of partial discharge signal receiving units for receiving an electromagnetic wave generated by partial discharge and a plurality of partial discharge signal processing units are prepared and are provided at plural places in a high voltage electric machine; and ether constitutional elements are the same as those of Embodiment 1 and therefore their description will be omitted.

Next, the operation of the partial discharge signal processing device according to Embodiment 3 will be described with reference to FIG. 7.

A plurality of partial discharge signal receiving units 1, 10 (FIG. 7 shows a case where two partial discharge signal receiving units are provided.) are mounted at different places in the high voltage electric machine; an electromagnetic wave received at the same time by electromagnetic wave receiving units 1a, 10a is transmitted as a high frequency partial discharge signal by transmitting units 1b, 10b through coaxial cables 3, 30; and processing of the partial discharge signal is performed by partial discharge signal processing units 2, 20. The operation of the partial discharge signal processing units 2, 20 is similar to Embodiment 1 and therefore its description will be omitted. Each partial discharge signal can be accurately processed by a difference in attenuation amount due to the length of the coaxial cables 3, 30 through which the partial discharge signal receiving units 1, 10 are connected to the partial discharge signal processing units 2, 20 and by correcting frequency characteristics. By this, the partial discharge can be captured at the same time at the plural places in the high voltage electric machine, accurate information of the partial discharge signal can be obtained by comparing each partial discharge, and monitoring of abnormality and grasping of an abnormality place can be easily performed.

As described above, according to the partial discharge signal processing device according to Embodiment 3, the plurality of the partial discharge signal receiving units are prepared and one partial discharge signal is processed at the same time by the plurality of the partial discharge signal processing units. Therefore, similar to those of Embodiment 1 are achieved; and an effect exists in that the partial discharge can be captured at the same time at the plural places in the high voltage electric machine, accurate information of the partial discharge signal can be obtained by comparing each partial discharge, and the monitoring of the abnormality and the grasping of the abnormality place can be easily performed.

Embodiment 4

Figure 8:
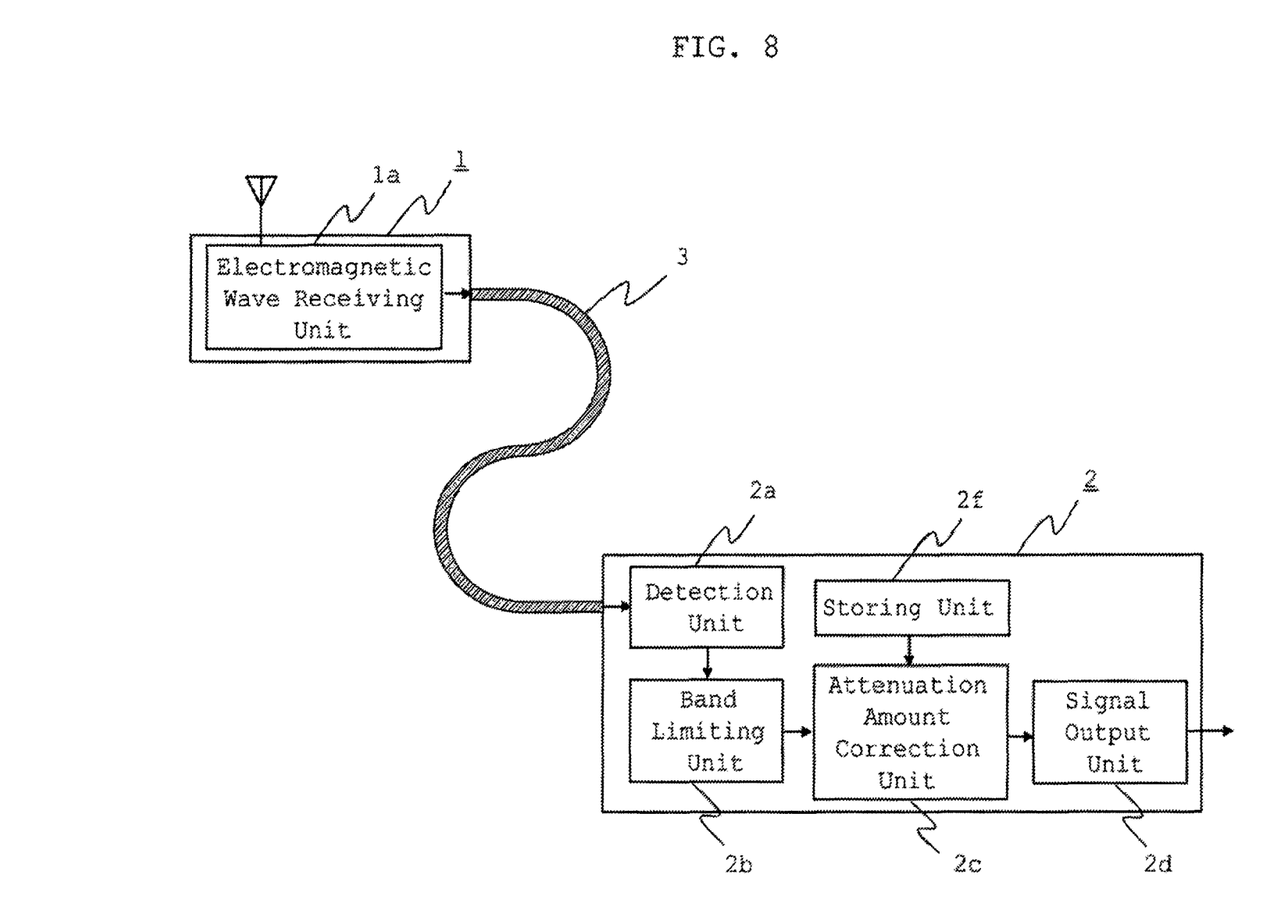
FIG. 8 is a view showing the schematic configuration of a partial discharge signal processing device according to Embodiment 4.

FIG. 8 is a view showing the schematic configuration of a partial discharge signal processing device according to Embodiment 4. A different point from the partial discharge signal processing device according to Embodiment 1 is that, in Embodiment 4, a storing unit that scores the attenuation characteristics of a coaxial cable is provided in a partial discharge signal processing unit. Other configuration is the same as that of Embodiment 1 and therefore its description will be omitted.

Next, the operation of a partial discharge signal processing device according to Embodiment 4 will be described with reference to FIG. 8.

As shown in FIG. 8, a storing unit 2f is provided in a partial discharge signal processing unit 2; the attenuation characteristics of a coaxial cable 3, the attenuation characteristics being shown in FIG. 2, is stored in the storing unit 2f; and an attenuated partial discharge signal is corrected by an attenuation amount correction unit 2c with reference to the stored data. If the length of the coaxial cable 3 is known, the attenuation amount due to the coaxial cable 3 can be estimated by inputting the length to the partial discharge signal processing unit 2 and the attenuated partial discharge signal can be easily returned to the strength of the partial discharge signal received by a discharge signal receiving unit 1. Other operation in the partial discharge signal processing unit 2 is similar to that of Embodiment 1 and therefore its description will be omitted.

As described above, according to the partial discharge signal processing device according to Embodiment 4, the storing unit is provided in the partial discharge signal processing unit and the attenuation characteristics of a transmission line is stored. Therefore, similar effects to those of Embodiment 1 are achieved; and an effect exists in that the attenuation amount can be easily estimated even when the length of the transmission line is changed and the strength of the partial discharge signal can be accurately corrected.

Embodiment 5

Figure 9:
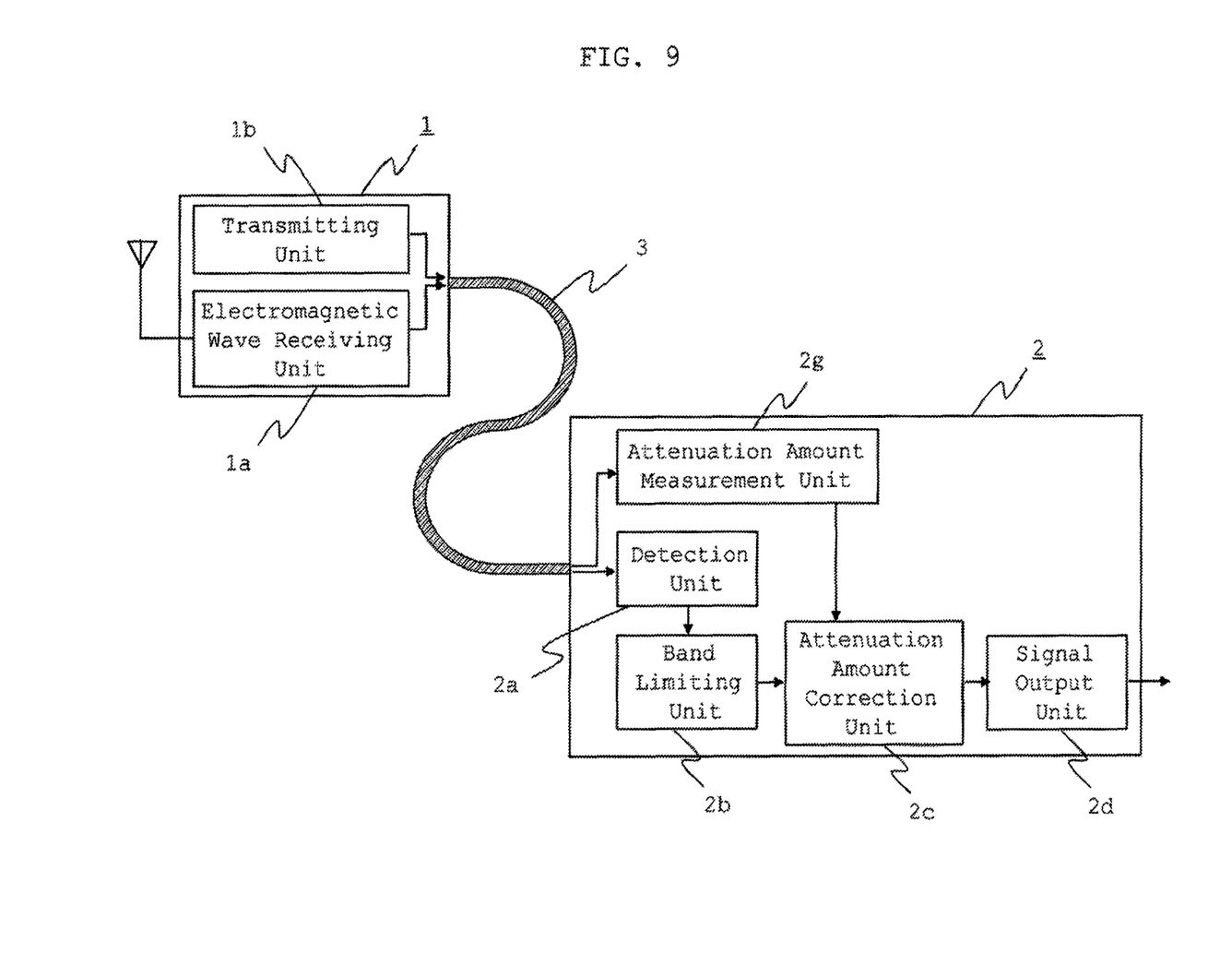
FIG. 9 is a view showing the schematic configuration of a partial discharge signal processing device according to Embodiment 5.

FIG. 9 is a view showing the schematic configuration of a partial discharge signal processing device according to Embodiment 5. A different point from the partial discharge signal processing device according to Embodiment 1 is that, in Embodiment 5, an attenuation amount measurement unit that measures the attenuation characteristics of a coaxial cable is provided in a partial discharge signal processing unit. Other configuration is the same as that of Embodiment 1 and therefore its description will be omitted.

Next, the operation of the partial discharge signal processing device according to Embodiment 5 will be described with reference to FIG. 9.

As shown in FIG. 9, an attenuation amount measurement unit 2g is provided in a partial discharge signal processing unit 2; in order to measure the attenuation amount of a coaxial cable 3, an attenuation amount measurement signal having a predetermined strength at a reference frequency f0 is transmitted to the coaxial cable 3 from a transmitting unit 1b placed in a partial discharge signal receiving unit 1; and the attenuation amount measurement signal is received by the attenuation amount measurement unit 2g of the partial discharge signal processing unit 2 to measure the attenuation amount. An attenuated partial discharge signal is corrected by an attenuation amount correction unit 2c on the basis of the measured attenuation amount. By this, the attenuation amount due to the actual coaxial cable 3 can be determined even when the length of the coaxial cable 3 is changed and the partial discharge signal attenuated during transmission of the partial discharge can foe easily returned to the strength of the partial discharge signal transmitted from the partial discharge signal receiving unit 1. Other operation of the partial discharge signal processing unit 2 is similar to that of Embodiment 1 and therefore its description will be omitted. The description has been made on the example in which the attenuation amount measurement unit 2g is newly provided in the above description; however, the detection unit 2a may have the function of the attenuation amount measurement unit 2g.

Figure 10:
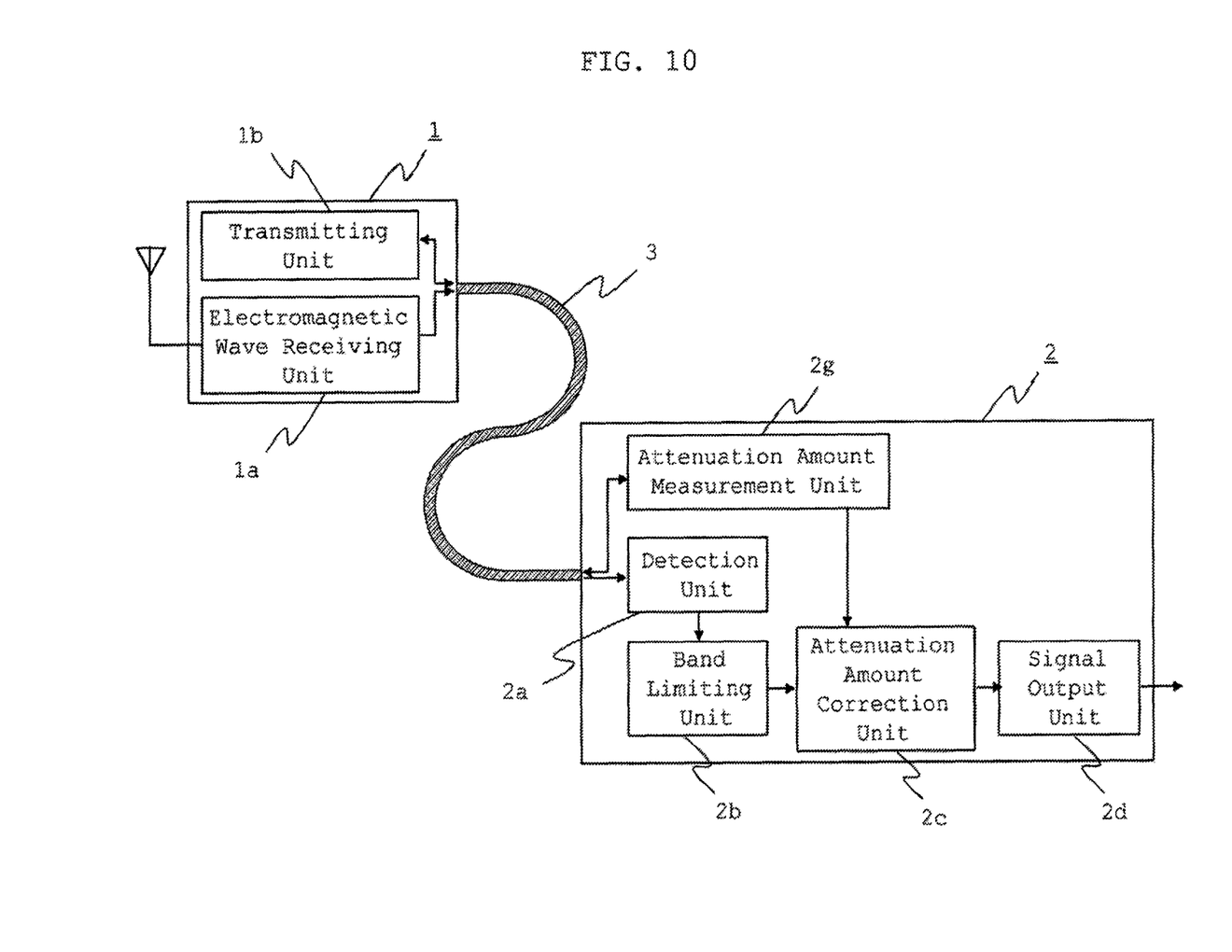
FIG. 10 is a view showing the schematic configuration of another partial discharge signal processing device according to Embodiment 5.

Furthermore, as shown in FIG. 10, as another method of measuring the attenuation amount of the coaxial cable 3, an attenuation amount measurement signal having a predetermined strength at a reference frequency f0 is transmitted from an attenuation amount measurement unit 2g to the coaxial cable 3 and is turned at a transmitting unit 1b of a partial discharge signal receiving unit 1; and the attenuation amount measurement signal passed through the coaxial cable 3 is received by the attenuation amount measurement unit 2g and the attenuation amount can also be measured.

As described above, according to the partial discharge signal processing device according to Embodiment 5, the attenuation amount measurement unit is provided in the partial discharge signal processing unit and the attenuation characteristics of a transmission line is measured. Therefore, similar effects to those of Embodiment 1 are achieved; and an effect exists in that the attenuation amount can be accurately determined even when the length of the transmission line is changed and the strength of the partial discharge signal can be accurately corrected.

Incidentally, the description has been made on the example in which the coaxial cable is used as the transmission line in the above Embodiment. However, in consideration of the length and the attenuation characteristics, if the reference frequency of the partial discharge signal due to the electromagnetic wave of the partial discharge can be transmitted, the transmission line is not limited to the coaxial cable and may be even a transmission line such as a twist pair line.

Furthermore, the description has been made on the operation in which the turbine generator serving as the high voltage electric machine is taken as the example in the above embodiments; however, this technique can also be applied to a high voltage electric machine other than the turbine generator.

Furthermore, the present invention can freely combine the respective embodiments and appropriately modify and/or omit the respective embodiments, within the scope of the present invention.

In addition, the same reference numerals as those shown in the drawings represent identical or corresponding elements.

DESCRIPTION OF REFERENCE NUMERALS 1, 10 Partial discharge signal receiving unit, 1a, 10a Electromagnetic wave receiving unit, 1b, 10b Transmitting unit, 2, 20 Partial discharge signal processing unit, 3, 30 Coaxial cable, 2a, 20a Detection unit, 2b, 20b Band limiting unit, 2c, 20c Attenuation amount correction unit, 2d, 20d Signal output unit, 2e Signal amplification unit, 2f Storing unit, 2g Attenuation amount measurement unit.

The invention claimed is:

1. A partial discharge signal processing device comprising:
- a partial discharge signal receiver that receives an electromagnetic wave as a partial discharge signal, which is generated by partial discharge in an electric machine;
- a partial discharge signal processor which detects the partial discharge signal, and performs signal processing; and
- a coaxial cable through which said partial discharge signal receiver is connected to said partial discharge signal processor to transmit the partial discharge signal,
- wherein said partial discharge signal processor includes:
- a frequency limiting circuitry which sets a reference frequency to equal to or higher than 1 GHz, and limits a frequency of the partial discharge signal by a frequency bandwidth at which fluctuations in attenuation amount are within 0.1 dB centering on the reference frequency;
- an attenuation amount correcting circuitry that corrects a value of the partial discharge signal at the bandwidth on the basis of the signal attenuation amount of signal attenuation characteristics at the bandwidth of said coaxial cable; and
- a signal outputting circuitry that outputs the corrected partial discharge signal.

2. The partial discharge signal processing device according to claim 1,
- wherein said partial discharge signal processor includes an amplifier that amplifies a value of the partial discharge signal on the basis of the signal attenuation amount due to said coaxial cable at the bandwidth.

3. The partial discharge signal processing device according to claim 1,
- wherein said partial discharge signal processor includes a memory which stores a characteristic value of the signal attenuation amount of said coaxial cable, and corrects a value of the partial discharge signal by using the characteristic value.

4. The partial discharge signal processing device according to claim 1,
- wherein said partial discharge signal processor includes an attenuation amount measuring circuitry which measures the signal attenuation amount of said coaxial cable, and corrects a value of the partial discharge signal on the basis of the measured signal attenuation amount.

* * * * *